United States Patent
Tang et al.

(10) Patent No.: US 8,134,387 B2
(45) Date of Patent: Mar. 13, 2012

(54) SELF-GATING SYNCHRONIZER

(75) Inventors: Bo Tang, Sunnyvale, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/151,700

(22) Filed: Jun. 2, 2011

(65) Prior Publication Data

US 2011/0285431 A1    Nov. 24, 2011

Related U.S. Application Data

(63) Continuation of application No. 12/784,751, filed on May 21, 2010, now Pat. No. 7,977,976.

(51) Int. Cl.
*H03K 19/00*    (2006.01)

(52) U.S. Cl. ............ 326/94; 326/93; 326/95; 326/98

(58) Field of Classification Search .......... 327/141, 327/146, 150, 155, 159, 198–203, 208–219
See application file for complete search history.

(56) References Cited

U.S. PATENT DOCUMENTS

| 7,091,742 | B2  | 8/2006  | Ryan |
| 7,795,921 | B2* | 9/2010  | Tanaka ............... 326/94 |
| 7,843,244 | B1* | 11/2010 | Tang et al. ........... 327/202 |
| 2008/0101513 | A1 | 5/2008 | Zhu et al. |
| 2009/0153202 | A1 | 6/2009 | Yagi |
| 2009/0238317 | A1 | 9/2009 | McCabe |
| 2009/0315601 | A1 | 12/2009 | Priel et al. |

* cited by examiner

*Primary Examiner* — Anh Tran
(74) *Attorney, Agent, or Firm* — Lawrence J. Merkel; Meyertons, Hood, Kivlin, Kowert & Goetzel, P.C.

(57) ABSTRACT

A synchronizer circuit for transferring data from a source clock domain to a target clock domain. A first latch in the target clock domain may capture a data value corresponding to current data received from the source clock domain. Under certain conditions, the first latch may enter into a metastable, or undefined logic state. A second latch may remain stable, and store a previous value corresponding to data that has most recently been transferred from the source clock domain to the target clock domain. The respective values output by the two latches may be compared by a detection circuit, and a value derived from the output value of the first latch and corresponding to the current data may be written to an output latch if the current data differs from the stored previous value. The detection circuit may also provide a defined logical value to the output latch even if the first latch is in a metastable state.

20 Claims, 4 Drawing Sheets

US 8,134,387 B2

SELF-GATING SYNCHRONIZER

PRIORITY DATA

This application is a continuation of U.S. application Ser. No. 12/784,751, filed on May 21, 2010 now U.S. Pat. No. 7,977,976.

BACKGROUND

1. Field of the Invention

This invention is related to the field of signal synchronization, more specifically to preventing propagation of metastable signals.

2. Description of the Related Art

Most circuits in today's digital systems are synchronous circuits. A synchronous circuit or system is characterized by a clock signal that is used to control operation of the system by synchronizing the various components/circuit elements of the system/circuit, including the operation of the system/circuit's memory/storage elements and latches. Ideally, in a synchronous system, every change in the respective logical levels of the system's storage components is simultaneous, following the level changes of the clock signal. The expectation is for the input signal into each storage element to have reached its final value before the next change in the clock signal occurs, to obtain a deterministic, predictable behavior of the system.

While running a digital system using a system clock may theoretically provide stable and predictable operation, there are certain conditions under which the operation of a synchronous digital system may yield unpredictable results. Many current digital systems are expansive and may be required to operate on more than a single clock signal. Each clock signal used in multi-clock system is characterized as representing its own clock domain. Often times signals from one clock domain need to be provided to portions of the system operating in a different clock domain. In this sense, the signal entering from one clock domain, considered the source clock domain, into another clock domain, considered the target clock domain, may be considered an asynchronous signal from the perspective of the target clock domain. Asynchronous signals, especially those entering storage elements with feedback paths, are prone to cause a condition referred to as metastable condition. Metastability is identified as an unstable electronic state (in a sense a very delicate equilibrium state) that can persist for an indefinite period of time. In digital systems, metastability typically describes a state that doesn't settle into a stable, defined logic value, i.e. a logic '0' or a logic '1' level within the time required for proper operation. This can result in various portions of the system, or even the entire system—depending on the signal path where the metastable condition first occurs—to enter and remain in an undefined state, producing unpredictable system behavior. Metastability is therefore considered a failure mode in most digital systems.

Although metastable states are not expected to occur in fully synchronous systems when the set-up and hold time specifications are satisfied, they are considered inherent in asynchronous digital systems and systems with more than one clock domain, as mentioned above. However, careful design techniques can often reduce failures caused by metastability. In digital circuits, latches and flip-flops are often susceptible to metastability. A flip-flop, for example, has two well-defined stable states, traditionally designated as logic '0' and logic '1' states, but under certain conditions the output of a flip-flop can hover between these two well defined states for longer than a clock cycle, in other words, the output of the flip-flop might become metastable. Most commonly, a flip-flop will traverse a point of metastability if its inputs change simultaneously, or almost simultaneously, that is, in close proximity to each other within a certain timing margin. In such cases, the flip-flop's setup and hold time requirements are in essentially violated. There is a high probability that a change in the input during the time from the setup to the hold time, when the input of the flip-flop is expected to remain stable, will cause the flip-flop to enter a metastable state.

Overall, where data travels from the output of a source flip-flop to the input of target flip-flop, metastability can be caused by at least one of two conditions. First, if the target clock has a different frequency than the clock used in operating the source flip-flop, the setup and hold time of the target flip-flop can be violated. Second, when the target and source clock have the same frequency, a phase alignment can cause the data to arrive at the target flip-flop during its setup and hold time. These conditions can result from fixed overhead or variations in logic delay times on the worst case path between the two flip flops, or variations in clock arrival times (clock skew), or yet other causes.

One way to alleviate these problems when crossing clock domains is the use of synchronizer circuits to prevent circuit outputs from remaining in a metastable state. Traditional synchronizer designs are based on a high-gain latch circuit as a resolution element, in which back-to-back inverters (in a feedback loop) are sized up, and used with very low threshold voltage ($V_{TH}$) transistors. In general, to meet the required mean time to failure (MTTF), multiple stage flip-flops may be needed which increases the overall latency. In addition, high-gain latches can use a significant amount of power, and are prone to leakage current as well.

SUMMARY

In one set of embodiments, a synchronizer circuit may be used to transfer data from a source clock domain to a target clock domain. A first latch in the target clock domain may capture a data value corresponding to current data from the source clock domain. Under certain conditions, the first latch may enter into a metastable state (i.e. an undefined logic state, or logically undefined state). A second latch may store a previous value (e.g. a most recent previous value) corresponding to data that has been transferred from the source clock domain to the target clock domain. The stored previous value may remain stable. The respective values output by the two latches may be compared by a detection circuit, and a value derived from the output value of the first latch and corresponding to the current data may be written to an output latch if the current data differs from the stored previous value. The detection circuit may also operate to provide a definite logical value even if the first latch is in a metastable state.

Instead of counting on high-gain latch to resolve a metastable condition, the second latch may save a separate copy of previous data, which may be compared with sampled current data by a detection circuit specifically designed to operate as further described below. The detection circuit is also referred to herein as the middle-stage of the synchronizer circuit. If the sampled current data has a value indicative of no change with respect to the previous data, there is no need to change the content of the output latch (also referred to herein as the slave latch), since the stored data in the second latch will be the same as the new data. When the sampled current data has a value indicative of a change with respect to the previous (stored) data, it may cause the detector circuit to be turned on, resulting in a value derived from the sampled current data being written into the slave latch. However, when the current data signal transitions at the same time, or very close to the same time as the clock signal on which the first latch is operated, the sampled current data may be in a metastable condition. In other words, the output of the first latch, which carries the sampled current data, may enter a metastable state as a result of the behavior of the current data signal when it reaches the first latch with the clock signal.

When the sampled current data is in a metastable state, a PMOS transistor and an NMOS transistor, within the detection circuit and driven by the first latch, may both be partially conducting. However, an upper PMOS transistor and a lower NMOS transistor, also within the detection circuit but driven by the second latch, may either have a pull-up or pull-down enabled but not both, resulting in the output (slave) latch driven to a clearly defined logical state. The output latch may be implemented with a two-branch keeper operating to prevent contention on the input of the output latch during a write operation into the output latch, which would occur when the sampled current data indicated that the current value differed from the previous value. In one set of embodiments, the two-branch keeper configuration may also be designed to prevent the input of the output latch from floating when the sampled current data indicates that current value is the same as the previous value. The propagation of the metastable state may therefore be blocked, resulting in the logic stage of the output of the synchronizer circuit residing at either a clear logic "1" state or a clear logic "0" state even when the output of the sampling latch resides in a metastable state.

At least one advantage of various embodiments of the synchronizer circuits disclosed herein is the elimination of the need for high-gain latches, which reduces power consumption and silicon area. Embodiments of the synchronizer circuits presented herein may also replace any multiple-stage synchronizer circuit with circuits featuring no more than two stages. The latency of synchronization may be thereby reduced, producing a noticeable gain in speed.

BRIEF DESCRIPTION OF THE DRAWINGS

The following detailed description makes reference to the accompanying drawings, which are now briefly described.

Figure 1:
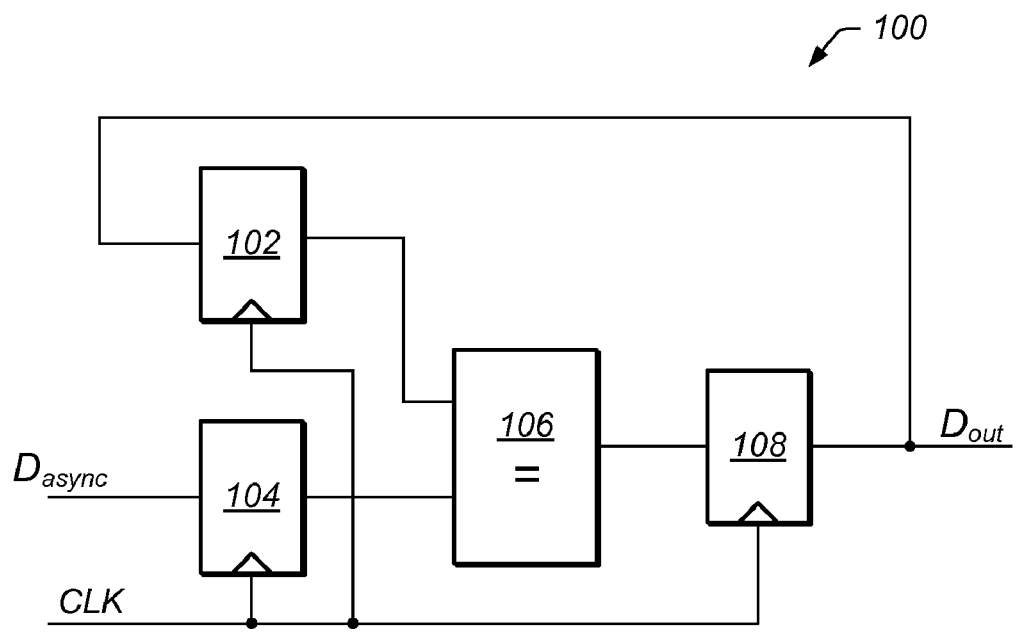
FIG. 1 shows the block diagram of one embodiment of a novel synchronizer circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

As described herein, for ease of reference, a data signal and/or a data value is said to be metastable, or in a metastable state when its value is undefined in terms of the expected logic values in a digital system. Such a state is also referenced as a logically undefined state, indicating for example that a voltage value representing the data value does not correspond to a logically defined state such as logic '0' or logic '1'. Accordingly, the behavior of such signal could potentially cause a circuit or logic block within a circuit/system—to which the data signal/value is provided—to also enter a metastable state, or logically undefined state, thereby propagating the metastable state within the system. For example, in a synchronous circuit operated according to a given clock signal, a data signal or data value provided to a given latch may transition at the same time, or very close to the same time as the clock signal/value on which the data value is gated by the given latch. This condition or occurrence has the potential of leading to a metastable state in the latch, resulting in the sampled/latched version of the data signal/value to be in a metastable, i.e. logically undefined state. The output of the given latch could then potentially cause the metastable state to propagate in the system, through any system element that is driven by the given latch. It is noted that the original signal itself may be clearly defined and not exhibit behavior characteristic of metastability, but its behavior, oftentimes in conjunction with the behavior of one or more other signals, has the potential of causing a metastable state.

FIG. 1 shows the block diagram of one embodiment of a novel synchronizer circuit 100, which may prevent a metastable state from propagating to the output $D_{out}$ of synchronizer circuit 100. In one set of embodiments, synchronizer circuit 100 may be used to transfer data from a first clock domain, e.g. a source clock domain to a second clock domain, e.g. a target clock domain. The target clock domain in the example provided in FIG. 1 is represented by clock signal CLK used in operating latches 102, 104, and 108. Thus, input signal $D_{async}$ may originate from a source clock domain, that is, $D_{async}$ may have been clocked on a clock signal different than clock signal CLK shown in FIG. 1, prior to entering a first latch, e.g. sampling latch 104. Therefore, input signal $D_{async}$ is asynchronous to synchronizer circuit 100, and the behavior of $D_{async}$ with respect to clock signal CLK has the potential of causing a metastable state in synchronizer circuit 100, in at least latch 104.

As shown in FIG. 1, sampler latch 104, which is operating in the target clock domain, may capture data from a source clock domain, namely via signal line $D_{async}$. The source clock domain may correspond to a system completely independent from the system that is operated using clock signal CLK, or it may be part of the same system. In any case, $D_{async}$ signal would be generated from a system, or portion of the system operating under a different clock signal than CLK. Under certain conditions, latch 104 may enter into a metastable state. This may occur, for example, when the input signal $D_{async}$ transitions at the same time, or in very close proximity to a gating, or latching transition of clock signal CLK. A second latch 102 (also referenced as feedback latch 102) may be used to store a previous valid value (e.g. a most recent previous value) that has been previously transferred from the source clock domain to the target clock domain. This value would originally have appeared at the output of output latch 108, and would have been a stable value representing a clearly defined logical state. A middle-stage detection circuit 106 may be used to compare the output value provided by feedback latch 102 with the output value provided by sampling latch 104. When the value output by sampler latch 104 (representing the sampled current value of input signal $D_{async}$) differs from the value output by feedback latch 102 (representing the sampled previous value of input signal $D_{async}$), detection circuit 106 may write the value output by sampler latch 102 to output latch 108.

When the value output by sampler latch 104 does not differ from the value output by feedback latch 102, there is no need to update output latch 108. Accordingly, under such conditions output latch may be left in its previous state to hold its previous data, which also represents the sampled current value of the input signal $D_{async}$, providing that value as its output $p_{out}$. Regardless of the value of $D_{async}$ when it reaches sampling latch 104, if the transition of $D_{async}$ results in the output of sampling latch 104 to enter into a metastable state, 106 is configured to provide, or drive, a definite logical value into output latch 108, to prevent that metastable state from propagating into output latch 108, and therefore potentially into other components of the system that may be driven by the output of output latch 108, that is, by the output of synchronizer circuit 100.

In one set of embodiments, this is accomplished by having the output of sampling latch 104 control a first portion of detection circuit 106, and have the output of feedback latch 102 control a second portion of detection circuit 106. Thus, when the sampled current data, that is, the output of sampling latch 104 is in a metastable state (exhibiting metastable behavior), the first portion of detection circuit 106 driven by the output of sampling latch 104, may be partially conducting. However, the second portion of detection circuit 106 driven by the output of feedback latch 102 may either have a pull-up or pull-down enabled but not both, resulting in detection circuit 106 driving a clearly defined logical state into output latch 108, when its input is in a metastable state.

Figure 2:
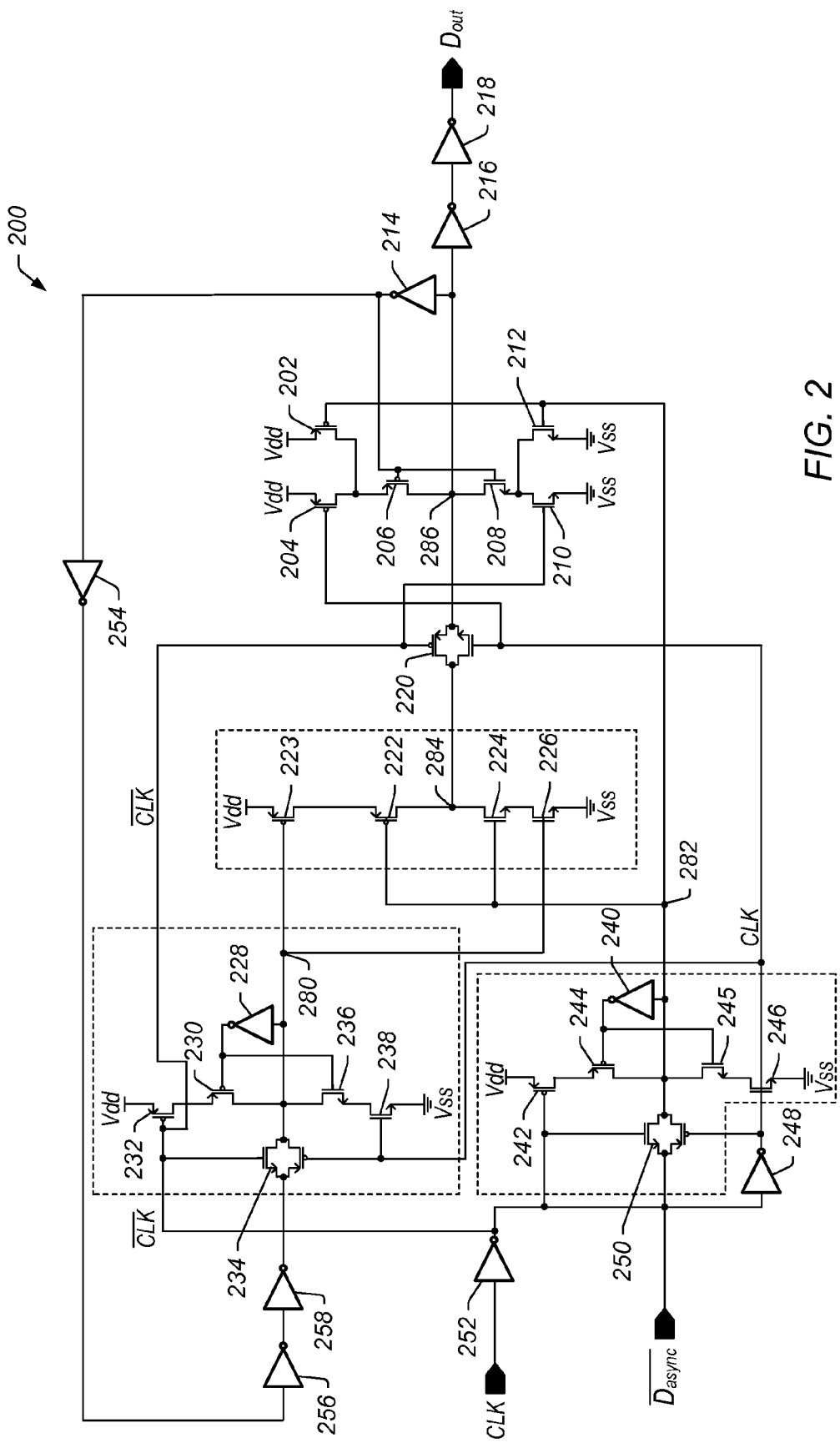
FIG. 2 shows the circuit diagram of one embodiment of the novel synchronizer circuit of FIG. 1.

FIG. 2 shows a detailed circuit diagram of one embodiment 200 of the novel synchronizer circuit 100 shown FIG. 1. In the embodiment shown in FIG. 2, synchronizer circuit 200 may be constructed using NMOS and PMOS transistor devices. Transistors 230 and 236 form a keeper-inverter (that is, the inverter whose output is used as the output of the latch) having its output coupled to the input of inverter 228, which in turn has its output coupled to the input of the keeper-inverter formed by transistors 230 and 236, to form a latch, which corresponds to feedback latch 102 from FIG. 1. In addition, transistor devices 232 and 238 may be used to gate the keeper-inverter output of the feedback latch, to prevent contention on the output of the keeper-inverter when a different value is driven into the latch than the value the latch was currently holding. The gating circuit implemented by transistors 232 and 238 is used in combination with transmission gate 234, which is used for clocking the latch. As shown in the embodiment of FIG. 2, transmission gate 234 is clocked on opposite phases of the clock with respect to transistors 232 and 238. In other words, when transmission gate 234 is enabled, transistors 232 and 238 are disabled, allowing data transmitted by transmission gate 234 to be conveyed to the input of the latch (i.e. to the input of inverter 228, and consequently, to the output of the keeper-inverter). In contrast, when transmission gate 234 is disabled, that is, when transmission gate 234 is not conveying data to the input of the latch, transistors 232 and 238 are turned on, allowing the data value presently held at the output of the keeper-inverter to remain there.

A similar structure may be used for sampling latch 104 and output latch 108, in synchronizer 200. Thus, in the embodiment shown in FIG. 2, sampling latch 104 is implemented by inverter 240 cross-coupled with a keeper-inverter, with the keeper-inverter implemented by transistors 244 and 245. Similar to feedback latch 102, the keeper-inverter of sampling latch 104 may also be gated, using transistors 242 and 246, and clocked by transmission gate 250, clocked on opposite phases of the clock CLK with respect to transistors 242 and 246. Thus, when transmission gate 250 is enabled, transistors 242 and 246 are disabled, allowing data transmitted by transmission gate 250 to be conveyed to the input of the latch (i.e. to the input of inverter 240, and consequently, to the output of the keeper-inverter). In contrast, when transmission gate 250 is disabled, that is, when transmission gate 250 is not conveying data to the input of the latch, transistors 242 and 126 are turned on, allowing the data value presently held at the output of the keeper-inverter to remain there.

Much like latches 102 and 104, a similar structure is used to construct output latch 108, with the memory element core of the latch implemented with inverter 214, and transistors 206 and 208, and transistors 204 and 210 operating as the gating transistors. Transmission gate 220 is used for gating the latch. However, the output latch, as shown in FIG. 2, also includes control transistors 202 and 212 to further control operation of gating transistors 204 and 210, respectively, as will be further described below. The middle-stage element (corresponding to detection circuit 106 from FIG. 1) of synchronizer circuit 200 is implemented with transistors 223, 222, 224, and 226. As seen in FIG. 2, the feedback latch (via output node 280) controls transistors 223 and 226, which may be considered to make up a first portion of the middle-stage element (detection circuit 106), while the sampling latch (via output node 282) controls transistors 222 and 224, which may be considered to make up a second portion of the middle-stage element.

The operation of synchronizer circuit 200 may be characterized as follows. An inverse of the arriving $D_{async}$ signal may be provided to the input of transmission gate 250. In other words, the sampling latch, as implemented in the embodiment shown in FIG. 2, is designed to receive an inverse version on the input signal $D_{async}$, as indicated at the input of transmission gate 250. Those of ordinary skill in the art will appreciate that alternate embodiments in which the sampling latch is receiving the original version of the input signal $D_{async}$ (as indicated in FIG. 1, for example) are possible, and that such variations would remain within the scope of the overall functionality of the embodiments discussed herein. When referencing the current value or current data carried by the input signal into the synchronizer, it is assumed that the current value/data refers to the value of $D_{async}$, not its inverse.

Current Data Value does not Change from Previous Data Value

When the current value of $D_{async}$ is the same as the sampled previous value stored in the feedback latch, the value that appears at node 280 will be different from the value that appears at node 282, (since an inverted version of $D_{async}$ is seen at the input of transmission gate 250), which will not change. It assumed at this point that the input signal $D_{async}$ changes in such a manner that the sampled current data at output node 282 is not in a metastable state. Thus, one of PMOS devices 223 and 222, and one of NMOS devices 224 and 226 will remain turned off. Which given transistor from each pair remains turned off will depend on the actual values at nodes 280 and 282. Thus, when the value at node 280 is logic '0' and the value at node 282 remains logic '1', PMOS device 222 and NMOS device 226 will remain turned off, while PMOS device 223 and NMOS device 224 will remain turned on. Conversely, when the value at node 280 is logic '1' and the value at node 282 remains logic '0', PMOS device 222 and NMOS device 226 will remain turned on, while PMOS device 223 and NMOS device 224 will remain turned off. In both of these cases, no device will be driving node 284, hence the voltage value at node 284 will become undetermined (i.e. floating).

However, when clock signal CLK turns off gating transistors 204 and 210 as it enables transmission gate 220, one of transistors 202 and 212 will still be turned on to allow node 286 to retain its present value even when transmission gate 220 is turned on with a floating voltage at node 284. More specifically, when the value at node 282 is logic '0', transistor 202 will remain turned on while transistor 212 will remain turned off, even when transistors 204 and 210 are turned off as a result of the clock signal CLK changing and enabling transmission gate 220. Since at this time the present output value at node 286 is logic '1', transistor 206 will also remain turned on and transistor 208 will remain turned off, and with both transistors 202 and 206 being turned on, and both transistors 208 and 212 being turned off, the value of logic '1' (i.e. the sampled previous value) will continue to hold at node 286. Similarly, when the value at node 282 is logic '1', transistor 212 will remain turned on while transistor 202 will remain turned off, even when transistors 204 and 210 are turned off as a result of the clock signal CLK changing and enabling transmission gate 220. Since at this time the present output value at node 286 is logic '0', transistor 208 will also remain turned on and transistor 206 will remain turned off, and with both transistors 202 and 206 being turned off, and both transistors 208 and 212 being turned on, the value of logic '0' (i.e. the sampled previous value) will continue to hold at node 286. Consequently, output $D_{out}$ will remain the same. In the embodiment shown, node 286 is coupled to the input of inverter 216, the output of which is coupled to the input of inverter 218, which may provide a strong signal output $D_{out}$, thereby not requiring transistors 206 and 208 to drive the data at the output synchronizer circuit 200.

Current Data Value Changes from Previous Data Value

When the current value of $D_{async}$ is different from the sampled previous value stored in the feedback latch, the value at node 282 will change from its previous value to become the same as the value that appears at node 280, assuming again that the input signal $D_{async}$ changes in such a manner that the sampled current data at output node 282 is not in a metastable state. Thus, depending on the actual value at both nodes 280 and 282, either both PMOS devices (223 and 222) will be turned on and both NMOS devices (224 and 226) will be turned off, or both PMOS devices (223 and 222) will be turned off and both NMOS devices (224 and 226) will be turned on. Specifically, when the value at nodes 280 is logic '0' and the sampled current value at node 282 also becomes logic '0', PMOS device 223 will remain turned on while PMOS device 222 is also turned on, and NMOS device 226 remains turned off while NMOS device 224 is also turned off. Conversely, when the value at node 280 is logic '1' and the sampled current value at node 282 also becomes logic '1', PMOS device 223 will remain turned off while PMOS device 222 is also turned off, and NMOS device 226 remains turned on while NMOS device 224 is also turned on. Therefore, in both of these cases, transistors 223, 222, 224, and 226 will collectively operate as an inverter, and thus the value at node 284 will become the inverse of the value at node 282. However, since the value at node 282 is itself an inverted version of the original value of $D_{async}$, the value appearing at node 284 will represent the sampled current value of signal $D_{async}$.

In this case, as in the previous case, when clock signal CLK turns off gating transistors 204 and 210 as it enables transmission gate 220, one of transistors 202 and 212 will still be turned on. However, since the value at node 282 at this time will be the same as the value at node 286, the combination of transistors turned on (among devices 202, 204, 206, 208, 210, and 212) will not result in contention at node 286, as only transmission gate 220 will be attempting to drive node 286 when transmission gate 220 is enabled. More specifically, when the value at node 282 is logic '0', transistor 202 will remain turned on while transistor 212 will remain turned off, even when transistors 204 and 210 are turned off as a result of the clock signal CLK changing and enabling transmission gate 220. Since at this time the present output value at node 286 is also logic '0', transistor 206 will also remain turned off while transistor 208 will remain turned on. With both transistors 210 and 212 being turned off, and transistor 206 being turned off when transmission gate 220 is turned on, transmission gate 220 may drive the new value onto node 286 without requiring time for the value at node 286 to resolve due to contention. Similarly, when the value at node 282 is logic '1', transistor 212 will remain turned on while transistor 202 will remain turned off, even when transistors 204 and 210 are turned off as a result of the clock signal CLK changing and enabling transmission gate 220. Since at this time the present output value at node 286 is also logic '1', transistor 208 will also remain turned off while transistor 206 will remain turned on. With both transistors 202 and 204 being turned off, and transistor 208 being turned off when transmission gate 220 is turned on, transmission gate 220 may drive the new value onto node 286 without requiring time for the value at node 286 to resolve due to contention.

Current Data Value Changes from Previous Data Value, and Results in Metastable State As previously mentioned, when the current value of $D_{async}$ changes with respect to the sampled previous value stored in the feedback latch, that is, when the $D_{async}$ changes from what it was during the previous clock cycle, under certain conditions the value at node 282 may enter a metastable state. This may happen, for example, when the value of $D_{async}$ changes such that the signal at the input of transmission gate 250 changes at a point in time close to the point in time when the value of clock signal CLK changes, possibly even changing at essentially the same time when the value of clock signal CLK also changes. In this case, the value at node 282 would be undetermined, that is, it would not reside at a clearly defined logic state, and as a result both transistors 222 and 224, and transistors 202 and 212 may be partially conducting current.

However, due to a clear logic value appearing at node 280, either transistor 223 or transistor 226 will be turned on, driving node 284 to a clearly defined logic state.

Specifically, when the value at node 280 is logic '0', indicating that the value of $D_{async}$ is changing from logic '0' to logic '1' with the expectation of ultimately yielding a logic '1' at node 286, transistor 223 will remain turned on while transistor 226 will remain turned off. With transistors 222 and 224 partially conducting and transistor 226 remaining turned off, turned on transistor 223 may operate as a pull-up and may pull node 284 to a clearly defined logic state '1', before transmission gate 220 is enabled. Thus, the metastable state at node 282 will be prevented from appearing at node 284, and furthermore the expected logic value '1' may be driven to node 286. Thus, in addition to the metastable state being prevented from propagating into the output latch, and therefore into any system component driven by synchronizer circuit 200, even in the event of a metastable state developing at node 282, a proper expected value may be driven to node 286, and thus provided at the output $D_{out}$.

Similarly, when the value at node 280 is logic '1', indicating that the value of $D_{async}$ is changing from logic '1' to logic '0' with the expectation of ultimately yielding a logic '0' at node 286, transistor 226 will remain turned on while transistor 223 will remain turned off. With transistors 222 and 224 partially conducting and transistor 223 remaining turned off, turned on transistor 226 may operate as a pull-down and may pull node 284 to a clearly defined logic state '0', before transmission gate 220 is enabled. Thus, the metastable state at node 282 will again be prevented from appearing at node 284, and furthermore the expected logic value '0' may be driven to node 286. It should also be noted that the respective channel width of each of transistors 223, 222, 224, and 226 may be specified to allow the value at node 284 to resolve quickly, in time for a stable value to appear at node 284 the next time transmission gate 220 is enabled. For example, in one set of embodiments, the relative channel widths of transistors 223, 222, 224, and 226 may be specified as 0.42, 1.26, 0.63, and 0.21, respectively. Of course these values are provided for illustrative purposes only, and other variations and modifications are possible while retaining the operating principles described herein.

Furthermore, inverters 254, 256, and 258 may be inserted between the input of the feedback latch (which in this case is the input of transmission gate 234) and the output of inverter 214 (representing the inverse of the output of synchronizer latch 200) to delay the output from node 286 before it reaches transmission gate 234, which drives the data onto node 280. In addition, similar to the function of inverters 216 and 218 at the output of synchronizer latch 200, this may also provide a stronger driver to drive the input of transmission gate 234, relaxing the size requirements on transistors 206 and 208. As also seen in FIG. 2, the operation of circuit 200 may be primarily determined by the relationship between the values appearing on nodes 280 and 282, corresponding to the values of $D_{out}$ and $D_{async}$, respectively, and the value appearing at node 284. Accordingly, the required relationship between nodes 280 and 282 may be established in a variety of ways based on $D_{out}$ and $D_{async}$, as long as the functionality of circuit 200 reflects the desired output expected from given values of $D_{out}$ and $D_{async}$. For example, if $D_{async}$ were provided to transmission gate 250 instead of instead of an inverse of $D_{async}$, instead of $D_{out}$, an inverse of $D_{out}$ may be provided to transmission gate 234, preserving the functionality of circuit 200. Similarly, if $D_{async}$ were provided to transmission gate 250, and $D_{out}$ were provided to transmission gate 234, and inverse value may be derived from the value appearing at node 284, and provided to transmission gate 220. In all cases, the respective values at node 280 and 282 would represent or correspond to $D_{out}$ and $D_{async}$, respectively, and the value provided to transmission gate 220, when not floating, would represent the desired update value corresponding to $D_{async}$.

Furthermore, as clearly illustrated in FIGS. 1 and 2, various embodiments of synchronizer circuits discussed herein may comprise two stages with respect to the number of clock cycles it may take for a change effected by an input signal or input signals to a first stage to propagate to the output or outputs of a last stage. For example, in FIG. 1, latches 102 and 104, and detection circuit 106 may be considered part of a first stage, and latch 108 may be considered part of a second stage. Thus, a change effected by $D_{async}$ and/or $D_{out}$ may be observed at $D_{out}$ in two clock cycles. As also seen in FIG. 1, while the second stage may receive values from the first stage, the first stage may also receive values from the second stage. Each stage may be updated simultaneously during any given clock cycle, and synchronizer circuit 100 may therefore operate in a pipeline-like manner. In some embodiments, synchronizer circuit may be initialized prior to beginning operation, to avoid undefined states at the various inputs. Numerous other variations and modifications will become apparent to those with ordinary skill in the art once the above disclosure is fully appreciated. It is intended that the following claims be interpreted to embrace all such variations and modifications.

Figure 3:
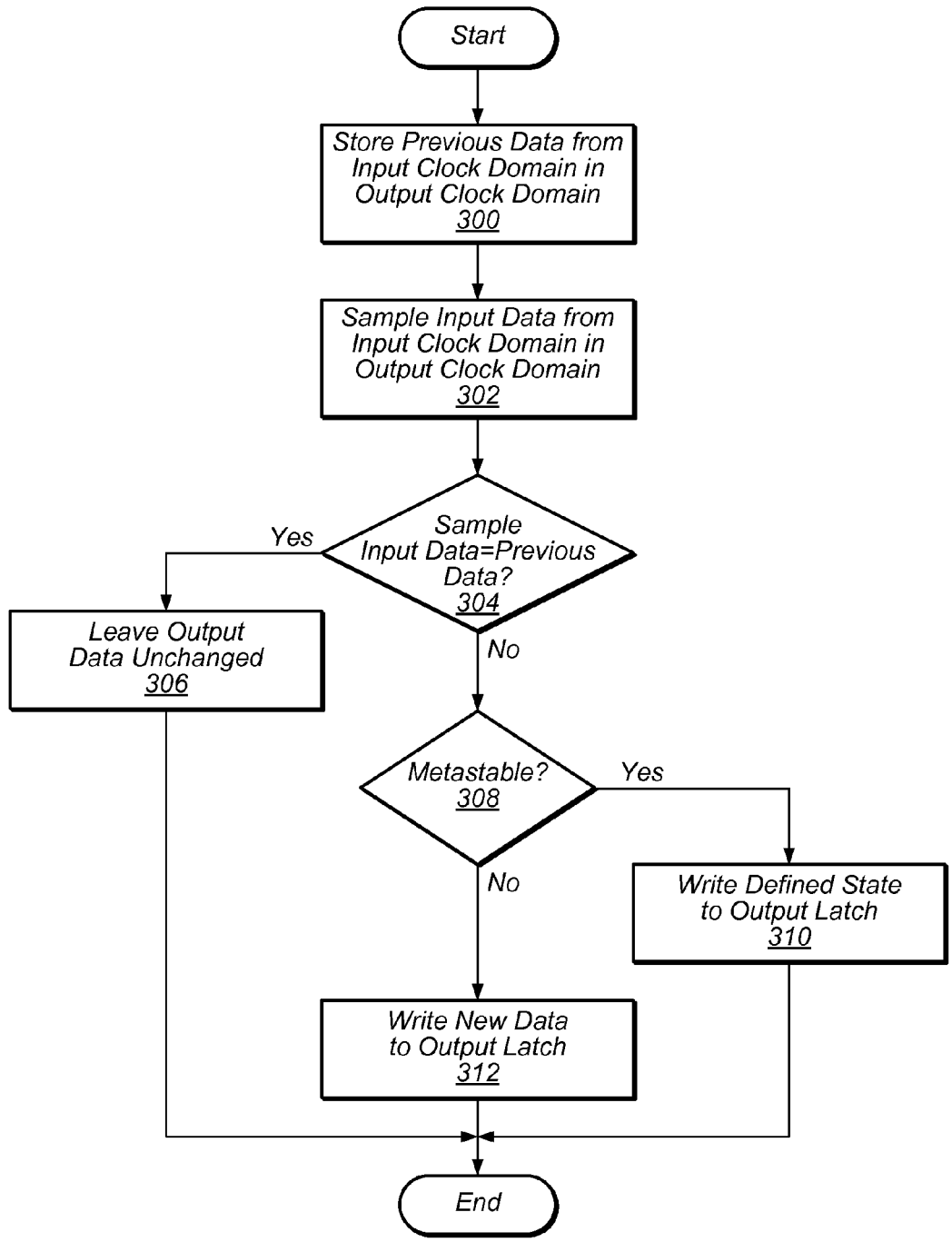
FIG. 3 is a flowchart illustrating one embodiment of the operation of the synchronizer circuits of FIGS. 1 and 2.

Turning now to FIG. 3, a flowchart is shown illustrating operation of one embodiment of the synchronizer circuit as shown in FIGS. 1 and/or 2. While the blocks are shown in a particular order for ease of understanding, other orders may be used. Blocks may be performed in parallel by the synchronizer circuit. Blocks, combinations of blocks, and/or the flowchart as a whole may be pipelined over multiple clock cycles.

The synchronizer may store the previous data from the input clock domain in the output clock domain (e.g. in the feedback latch 102-block 300 in FIG. 3). The synchronizer may sample, in the output clock domain, input data from the input clock domain (e.g. in the latch 104-block 302 in FIG. 3). If the sampled input data is the same as the previous data (decision block 304, "yes" leg), the synchronizer may leave the output data (e.g. in the output latch 108) unchanged (block 306). If the sampled input data is metastable (decision block 308, "yes" leg), the synchronizer may write a defined logic state into the output latch (block 310). If the sampled input data is not the same as the previous data (decision block 304, "no" leg) and the sampled input data is not metastable (decision block 308, "no" leg), the synchronizer may write the newly sampled data to the output latch (block 312).

System

Figure 4:
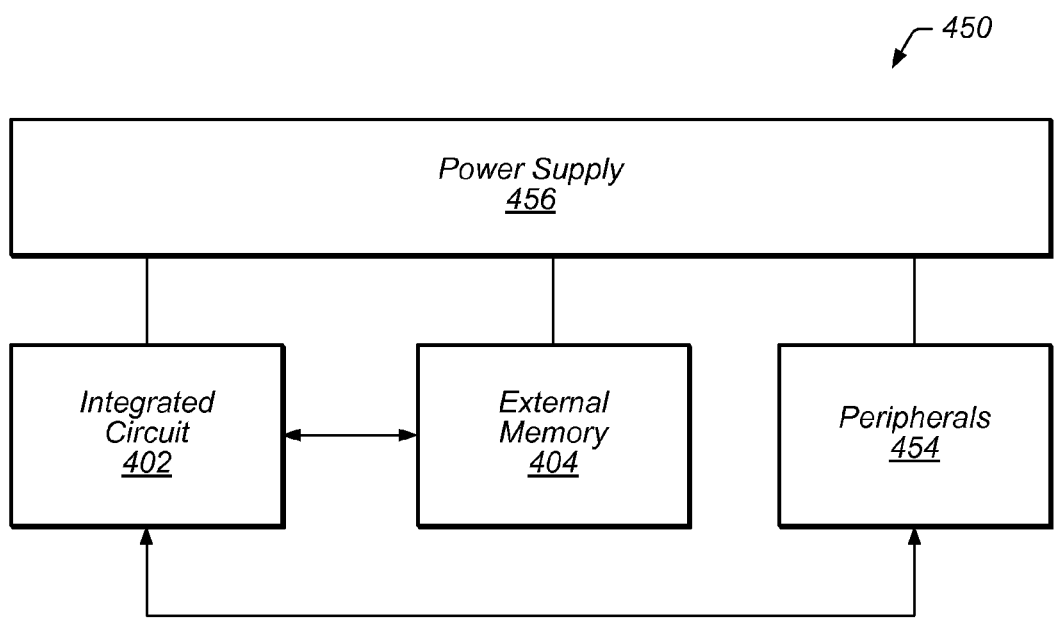
FIG. 4 is a block diagram of one embodiment of a system.

Turning next to FIG. 4, a block diagram of one embodiment of a system 450 is shown. In the illustrated embodiment, the system 450 includes at least one instance of an integrated circuit 402 coupled to an external memory 404. The integrated circuit 402 is further coupled to one or more peripherals 454. A power supply 456 is also provided which supplies the supply voltages to the integrated circuit 402 as well as one or more supply voltages to the memory 404 and/or the peripherals 454. In some embodiments, more than one instance of the integrated circuit 402 may be included (and more than one external memory 404 may be included as well).

The integrated circuit 402 may include one or more synchronizers such as those shown in FIGS. 1 and/or 2 to synchronize external signals into the integrated circuit 402. Alternatively or in addition, the integrated circuit 402 may include two or more clock domains and may include synchronizer circuits to synchronize signals across the clock domain boundaries.

The peripherals 454 may include any desired circuitry, depending on the type of system 450. For example, in one embodiment, the system 450 may be a mobile device (e.g. personal digital assistant (PDA), smart phone, etc.) and the peripherals 454 may include devices for various types of wireless communication, such as wifi, Bluetooth, cellular, global positioning system, etc. The peripherals 454 may also include additional storage, including RAM storage, solid state storage, or disk storage. The peripherals 454 may include user interface devices such as a display screen, including touch display screens or multitouch display screens, keyboard or other input devices, microphones, speakers, etc. In other embodiments, the system 450 may be any type of computing system (e.g. desktop personal computer, laptop, workstation, net top etc.).

We claim:

1. A method for synchronizing data from a source clock domain operating according to a source clock, to a target clock domain operating according to a target clock, the method comprising:
   clocking an input data value originating from the source clock domain into a first latch using the target clock, during a present cycle of the target clock, to obtain a clocked input data value;
   clocking an output data value into a second latch using the target clock, during the present cycle of the target clock, to obtain a clocked output data value;
   comparing the clocked input data value with the clocked output data value during the present cycle of the target clock;
   when the comparing indicates that the clocked input data value is the same as the clocked output data, leaving the output data value unchanged; and
   when the comparing indicates that the clocked input data value is different from the clocked output data:
      if the clocked input data value does not exhibit metastable behavior, clocking the clocked input data into a third latch using the target clock, during a next cycle of the target clock, to update the output data value; and
      if the clocked input data value exhibits metastable behavior, clocking a defined logical state into the third latch using the target clock, during the next cycle of the target clock, to update the output data value.

2. The method of claim 1, wherein clocking the defined logical state into the third latch comprises clocking a clearly defined logical state equivalent to the input data into the third latch.

3. The method of claim 1, wherein comparing the clocked input data value with the clocked output data value comprises the clocked input data value and the clocked output data value driving a detection circuit.

4. The method of claim 3, wherein the clocked input data value and the clocked output data value driving the detection circuit comprises the clocked input data value driving a first portion of the detection circuit, and the clocked output data value driving a second portion of the detection circuit.

5. The method of claim 4, wherein the clocked input data value driving the first portion of the detection circuit comprises the first portion of the detection circuit partially conducting when the clocked input data exhibits metastable behavior.

6. The method of claim 4, wherein the clocked output data value driving the second portion of the detection circuit comprises one of:

enabling a pull-up within the detection circuit; and
enabling a pull-down within the detection circuit.

7. A synchronizer circuit having a data input and a data output, the synchronizer circuit comprising:
   a first D flip-flop (DFF) having an input configured to receive, through the data input, input data from a source clock domain operating according to a source clock signal, and clock the input data on a target clock signal to provide corresponding first output data at an output of the first DFF;
   a second DFF having an input configured to receive synchronizer output data from the data output, and clock the synchronizer output data on the target clock signal to provide corresponding second output data at an output of the second DFF;
   a detector circuit providing a detector output usable to produce the synchronizer output data, and configured to:
      receive and compare the first output data and the second output data;
      update the detector output to the value of the first output data, if the first output data and the second output data are different and the first output data has a clearly defined logical value; and
      drive the detector output to a defined logical value, if the first output data and the second output data are different and the first output data has an undefined logical value.

8. The synchronizer circuit of claim 7, wherein the detector circuit is further configured to leave the detector output unchanged if the first output data and the second output data are the same.

9. The synchronizer circuit of claim 7, further comprising:
   a third DFF having an input configured to receive the detector output, and clock the detector output on the target clock signal to provide the synchronizer output data to the data output.

10. The synchronizer circuit of claim 8, wherein the third DFF is implemented with a two-branch keeper operating to prevent contention on the input of the third DFF when the first output data and the second output data are different.

11. The synchronizer circuit of claim 7, wherein one or more respective DFFs of the first DFF and the second DFF comprise:
   a first inverter having an output configured as the output of the respective DFF;
   a second inverter having an input connected to the output of the first inverter, and further having an output connected to an input of the first inverter; and
   a pair of transistor devices configured to gate the output of the first inverter to prevent contention on the output of the first inverter when a different value is driven into the respective DFF than a value the respective DFF is presently holding.

12. The synchronizer circuit of claim 11, wherein the respective DFF further comprises a transmission gate having:
   an input configured as the input of the respective DFF;
   an output connected to the output of the first inverter;
   a pair of control terminals configured to respectively receive opposite phases of the target clock signal for clocking data provided to the input of the respective DFF;
   wherein the transmission gate is configured to be clocked on opposite phases of the clock with respect to the pair of transistor devices.

13. The synchronizer circuit of claim 7, further comprising a third DFF having an input configured to receive the detector output, and clock the detector output on the target clock signal to provide the synchronizer output data to the data output;
  wherein one or more respective DFFs of the first, second, and third DFF comprise:
    a first inverter having an output configured as the output of the respective DFF;
    a second inverter having an input connected to the output of the first inverter, and further having an output connected to an input of the first inverter;
    a pair of transistor devices configured to gate the output of the first inverter to prevent contention on the output of the first inverter when a different value is driven into the respective DFF than a value the respective DFF is presently holding; and
    a transmission gate having:
      an input configured as the input of the respective DFF;
      an output connected to the output of the first inverter;
      a pair of control terminals configured to respectively receive opposite phases of the target clock signal for clocking data provided to the input of the respective DFF;
    wherein the transmission gate is configured to be clocked on opposite phases of the clock with respect to the pair of transistor devices.

14. A system comprising:
  an external memory;
  one or more peripheral devices;
  an integrated circuit coupled to the external memory and the one or more devices;
  wherein the integrated circuit further comprises one or more synchronizer circuits configured to synchronize signals across boundaries of two or more clock domains operating according to different respective clock signals;
  wherein at least one respective synchronizer circuit of the one or more synchronizer circuits comprises:
    a first latch operating according to a first clock signal corresponding to a first clock domain of the two or more clock domains, and configured to latch a first data value representative of a present output value of the synchronizer circuit, to produce a first output value;
    a second latch operating according to the first clock signal, and configured to latch a second data value representative of a current data value originating from a second clock domain of the two or more clock domains, to produce a second output value;
    a third latch operating according to the first clock signal, and configured to store the present output value of the synchronizer circuit; and
    a detector circuit configured to:
      receive the first output value and the second output value; and
      drive a defined logic value corresponding to the current data value into the third latch using the first output value when the second output value represents an undefined logic state, to update the present output value of the synchronizer circuit in the third latch and to ensure the present output value of the synchronizer circuit represents a defined logic state.

15. The system of claim 14, wherein the integrated circuit comprises:
  one or more first components configured to operate according to the first clock signal; and
  one or more second components configured to operate according to the second clock signal;
  wherein the at least one respective synchronizer circuit is configured to synchronize signals between the one or more first components and the one or more second components.

16. The system of claim 14, wherein the integrated circuit is configured to operate according to the first clock signal, wherein the at least one respective synchronizer circuit is configured to synchronize signals received by the integrated circuit from one or more circuits outside the integrated circuit.

17. The system of claim 14, wherein the detector circuit comprises:
  a first pair of transistors, each transistor of the first pair of transistors having a respective control terminal configured to receive the first output value; and
  a second pair of transistors coupled to the first pair of transistors, each transistor of the second pair of transistors having a respective control terminal configured to receive the second output value;
  wherein the second pair of transistors is configured to partially conduct current when the second output value represents an undefined logic state; and
  wherein the first pair of transistors are configured to drive a common node to the defined logic value when the second pair of transistors are partially conducing current, wherein the common node couples a channel terminal of a first transistor of the second pair of transistors to a channel terminal of a second transistor of the second pair of transistors.

18. The system of claim 17, wherein the third latch is configured to latch a data value derived from the common node to update the present output value of the synchronizer circuit.

19. The system of claim 18, wherein the third latch is further configured to maintain the present output value of the synchronizer circuit when the first pair of transistors and the second pair of transistors are each partially conducting current.

20. The system of claim 14, wherein the system is a mobile device, and the one or more peripheral devices comprise respective circuits configured to provide wireless communication capabilities for the mobile device.

* * * * *